US009412969B2

(12) United States Patent
Kim et al.

(10) Patent No.: US 9,412,969 B2
(45) Date of Patent: Aug. 9, 2016

(54) ORGANIC ELECTRO-LUMINESCENT DISPLAY AND METHOD OF FABRICATING THE SAME

(71) Applicant: Samsung Electronics Co., Ltd., Suwon-si, Gyeonggi-do (KR)

(72) Inventors: Joonghyuk Kim, Seoul (KR); Sunggyu Kang, Suwon-si (KR); Jaewoo Chung, Seoul (KR); Youngki Hong, Anyang-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/594,247

(22) Filed: Jan. 12, 2015

(65) Prior Publication Data

US 2016/0020424 A1 Jan. 21, 2016

(30) Foreign Application Priority Data

Jul. 16, 2014 (KR) ........................ 10-2014-0089899

(51) Int. Cl.
*H01L 51/52* (2006.01)
*H01L 27/32* (2006.01)
*H01L 51/56* (2006.01)
*H01L 51/00* (2006.01)

(52) U.S. Cl.
CPC ........ *H01L 51/5253* (2013.01); *H01L 27/3246* (2013.01); *H01L 51/0004* (2013.01); *H01L 51/56* (2013.01); *H01L 2227/323* (2013.01)

(58) Field of Classification Search
CPC ....................................................... H01L 24/29
See application file for complete search history.

(56) References Cited

U.S. PATENT DOCUMENTS

| 6,369,507 | B1 * | 4/2002 | Arai ............................ 313/506 |
| 6,689,632 | B2 | 2/2004 | Kim et al. |
| 7,535,169 | B2 | 5/2009 | Kobayashi |
| 2004/0012058 | A1 * | 1/2004 | Aoki ............................ 257/414 |
| 2005/0266763 | A1 * | 12/2005 | Kimura et al. ................. 445/24 |
| 2005/0285509 | A1 * | 12/2005 | Funamoto et al. ............ 313/504 |
| 2006/0223221 | A1 * | 10/2006 | Ishii ............................... 438/99 |
| 2006/0273314 | A1 * | 12/2006 | Lee ................................. 257/59 |
| 2010/0252857 | A1 * | 10/2010 | Nakatani et al. .............. 257/100 |

(Continued)

FOREIGN PATENT DOCUMENTS

| JP | 2009-272277 A | 11/2009 |
| JP | 4547038 B2 | 7/2010 |

(Continued)

OTHER PUBLICATIONS

Chesterfield, et al., "Solution-Coating Technology for AMOLED Displays", Information Display, SID, 2011, pp. 24-30.

(Continued)

*Primary Examiner* — Mohammad Islam
*Assistant Examiner* — Ankush Singal
(74) *Attorney, Agent, or Firm* — Cantor Colburn LLP

(57) ABSTRACT

An organic electro-luminescent display includes an anode electrode disposed in a pixel region, on a substrate, a bank adjacent to an edge of the anode electrode, on the substrate, to define the pixel region, a hole injection layer on the anode electrode, to be separated from a sidewall of the bank by a first distance, a hole transport layer and an emissive layer sequentially disposed on the hole injection layer, in the pixel region, and a cathode electrode disposed on the emissive layer.

7 Claims, 8 Drawing Sheets

(56) References Cited

U.S. PATENT DOCUMENTS

| | | | | |
|---|---|---|---|---|
| 2010/0289728 | A1* | 11/2010 | Nakatani et al. | 345/76 |
| 2011/0121301 | A1* | 5/2011 | Kim et al. | 257/59 |
| 2011/0221789 | A1* | 9/2011 | Ota | 345/690 |
| 2012/0132935 | A1* | 5/2012 | Isobe et al. | 257/88 |
| 2012/0228590 | A1* | 9/2012 | Matsumi | 257/40 |
| 2012/0305952 | A1* | 12/2012 | Takei | 257/89 |
| 2014/0077202 | A1 | 3/2014 | Zhou et al. | |
| 2014/0138658 | A1* | 5/2014 | Aonuma | 257/40 |
| 2014/0154818 | A1* | 6/2014 | Shimamura et al. | 438/4 |
| 2015/0132878 | A1* | 5/2015 | Kawanami et al. | 438/46 |
| 2015/0221709 | A1* | 8/2015 | Shimamura et al. | |

FOREIGN PATENT DOCUMENTS

| | | |
|---|---|---|
| JP | 2011-249089 A | 12/2011 |
| JP | 2012-074225 A | 4/2012 |
| KR | 10-0437533 B1 | 6/2004 |

OTHER PUBLICATIONS

Chen et al., "Evaporation evolution of volatile liquid droplets in nanoliter wells", Sensors and Actuators, A 130-131, 2006, pp. 12-19.

* cited by examiner

ORGANIC ELECTRO-LUMINESCENT DISPLAY AND METHOD OF FABRICATING THE SAME

CROSS-REFERENCE TO RELATED APPLICATIONS

This application claims priority to Korean Patent Application No. 10-2014-0089899, filed on Jul. 16, 2014, and all the benefits accruing therefrom under 35 U.S.C. §119, the disclosure of which is incorporated herein in its entirety by reference.

BACKGROUND

1. Field

Provided are organic electro-luminescent displays and methods of fabricating the same using an inkjet printing method.

2. Description of the Related Art

An inkjet printing apparatus prints a predetermined image by ejecting relatively fine ink droplets on a desired location of a printing medium. The application of the inkjet printing apparatus is extended to various fields, for example, flat panel display device fields, such as liquid crystal displays ("LCDs") and organic light-emitting device ("OLED") displays, flexible display device fields such as including electronic paper ("E-paper"), printed electronics fields such as including metal wirings, and organic thin film transistors ("OTFTs").

When a film is formed by droplets ejected by the inkjet printing apparatus, the shape of droplets that initially attach to a printing medium on which an image is printed such as a substrate may vary according a surface energy between the ink and the substrate. A solute of the ink may agglomerate in a ring shape due to pinning that occurs at edges of the ink that is attached to the substrate while the ink is drying, or the solute of the ink may concentrate in the center of the ink droplet without pinning.

SUMMARY

Relating to display devices including an organic light-emitting layer, when a hole injection layer is formed along a bank sidewall, an electric short circuit between an anode electrode and a cathode electrode within a display device may occur, and a thickness of the organic light-emitting layer is not uniform. Thus, brightness of the organic light-emitting layer in the display device may not be uniform and the lifetime of the organic light-emitting layer and/or the display device may be undesirably reduced. Therefore, there remains a need for an improved display device which reduces an electric short circuit between an anode electrode and a cathode electrode therein, and increases uniformity of an organic light-emitting layer, to therefore have increased brightness and life span.

Provided are organic electro-luminescent displays including a hole injection layer that is separated from a sidewall of a bank by a first distance, and methods of fabricating the same.

Additional embodiments will be set forth in part in the description which follows and, in part, will be apparent from the description, or may be learned by practice of the example embodiments.

According to an embodiment, an organic electro-luminescent display includes: an anode electrode disposed in a pixel region, on a substrate; a bank adjacent to an edge of the anode electrode, on the substrate to define the pixel region; a hole injection layer on the anode electrode, to be separated from a sidewall of the bank by a first distance; a hole transport layer and an emissive layer sequentially disposed on the hole injection layer, in the pixel region; and a cathode electrode disposed on the emissive layer.

The sidewall of the bank may include a lyophobic coating, and the sidewall lyophobic coating may extend to cover a portion of the first distance between the hole injection layer and the sidewall of the bank.

The sidewall lyophobic coating may be disposed between a remainder of the bank and the hole transport layer, and between the remainder of the bank and the emissive layer.

The lyophobic coating may include a material having a surface energy lower than a surface energy of an upper surface of the anode electrode.

A thickness of the lyophobic coating may be in a range from about 1 nanometer (nm) to about 10 nanometers (nm).

The extended lyophobic coating which covers the portion of the first distance between the hole injection layer and the sidewall of the bank, may contact an edge of the hole injection layer.

The first distance may be in a range from about 1 micrometer (μm) to about 10 micrometers (μm).

The bank may overlap an edge of the anode electrode.

According to an embodiment, a method of fabricating an organic electro-luminescent display includes: forming an anode electrode in a pixel region, on a substrate; forming a bank adjacent to the anode electrode, on the substrate, where a sidewall of the bank defines an opening portion which defines the pixel region; forming the sidewall of the bank to include a lyophobic coating, where the sidewall lyophobic coating extends outwards to overlap the bank and extends inwards from the bank by a first distance; forming a hole injection layer on the anode electrode, to be disposed on an inner side of the extended lyophobic coating which is extended inwards from the bank by the first distance; sequentially forming a hole transport layer and an emissive layer on the hole injection layer; and forming a cathode electrode on the emissive layer, to cover the bank.

The forming the sidewall of the bank to include the lyophobic coating may include: forming a photoresist pattern to be separated from the sidewall of the bank by the first distance; forming the lyophobic coating to overlap the bank and the photoresist pattern on the substrate; and removing the lyophobic coating overlapping the photoresist pattern by removing the photoresist pattern.

The forming the sidewall of the bank to include the lyophobic coating may include: forming the lyophobic coating on the substrate, to overlap the bank and the pixel region; and removing a portion of the lyophobic coating overlapping the pixel region and a portion extended further than the first distance from the bank, by irradiating an ultraviolet ray through a mask opening corresponding to the opening portion, onto the portion of the lyophobic coating overlapping the pixel region and the portion extended further than the first distance from the bank.

The forming the hole injection layer may include removing the lyophobic coating by heating the substrate.

BRIEF DESCRIPTION OF THE DRAWINGS

These and/or other features will become more readily appreciated from the following description of the embodiments, taken in conjunction with the accompanying drawings in which.

These and/or other features will become more readily appreciated from the following description of the embodiments, taken in conjunction with the accompanying drawings in which.

DETAILED DESCRIPTION

Figure 1:
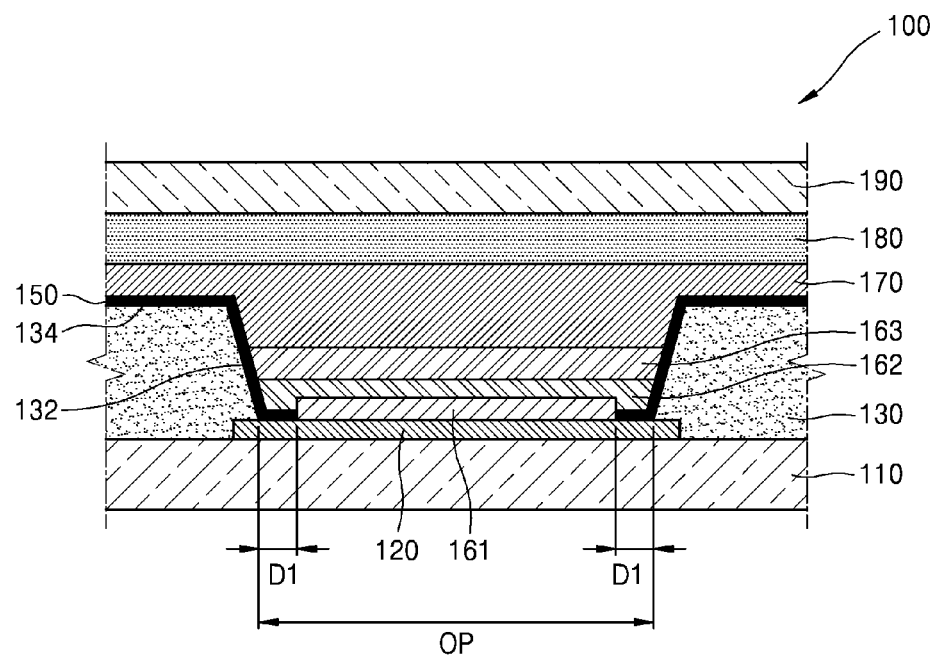
FIG. 1 is a schematic cross-sectional view of a pixel structure of an organic electro-luminescent display according to an embodiment.

Reference will now be made in detail to embodiments, examples of which are illustrated in the accompanying drawings. In the drawings, the thicknesses of layers and regions are exaggerated for clarity. This invention may, however, be embodied in many different forms and should not construed as limited to the embodiments set forth herein.

It will also be understood that when an element is referred to as being "above" or "on" another element, it can be directly on the other element or intervening layers may also be present. Like reference numerals in the drawings denote like elements throughout the specification, and thus their description will be omitted.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a schematic cross-sectional view of a pixel structure of an organic electro-luminescent display 100 according to an embodiment. The organic electro-luminescent display 100 may include a plurality of pixels. However, in FIG. 1, only one pixel is shown for convenience as an example, and thus, descriptions of the other pixels are omitted.

Referring to FIG. 1, the organic electro-luminescent display 100 includes a first substrate 110 and a second substrate 190 that are disposed in parallel, facing each other. The first substrate 110 may include glass or plastic, such as polyethylene naphthalate ("PEN"), polyimide ("PI") or polyethylene terephthalate ("PET"). The second substrate 190 may include a transparent material, for example, glass or plastic, such as PEN, PI or PET.

An anode electrode 120 is disposed on a pixel region of a pixel, on the first substrate 110. In an embodiment of manufacturing the organic electro-luminescent display 100, the anode electrode 120 may be formed by patterning an anode material layer to a pixel size. The anode electrode 120 may include indium tin oxide ("ITO"). The aforementioned pixel region may be a sub-pixel region of a pixel, that emits a single color.

A bank 130 is disposed adjacent to the anode electrode 120, and may be disposed around the anode electrode 120 in a top plan view of the organic electro-luminescent display 100. Portions of the bank 130 define an opening portion OP therein. The opening portion OP may define the pixel region but the invention is not limited thereto. In an embodiment of manufacturing the organic electro-luminescent display 100, the bank 130 may be formed by patterning a material layer including PI, and also, may be formed of silicon oxide or silicon nitride.

As depicted in FIG. 1, a bottom surface of the bank 130 may cover (e.g., overlap) an edge of the anode electrode 120. In an embodiment, the bottom surface of the bank 130 may be disposed separated from an edge of the anode electrode 120. As depicted in FIG. 1, a sidewall 132 of the bank 130 may be slanted or inclined at a predetermined angle with respect to the bottom surface of the bank 130.

A hole injection layer 161 is disposed on the anode electrode 120. The hole injection layer 161 is disposed separated from the sidewall 132 of the bank 130 by a first distance D1. The first distance D1 may be approximately in a range from about 1 micrometers (μm) to about 10 μm.

A lyophobic coating layer 150 (otherwise referred to as "lyophobic coating") may be disposed on the bank 130. The lyophobic coating 150 may have a thickness in a direction normal to a surface of the bank 130 in a range from about 1 nanometer (nm) to about 10 nanometers (nm). The lyophobic coating 150 includes a material having a lyophobic characteristic with respect to ink of an organic light-emitting device. In an embodiment, for example, the lyophobic coating 150 may include a self-assembled monolayer ("SAM"), such as octadecyltrichlorosilane (ODTS) or n-octadecyltrichlorosilane, or an organic material that includes fluorine and has relatively low surface energy, for example, EGC-1700 of 3M™ company.

The lyophobic coating 150 covers an upper surface 134 and extends to the sidewall 132 of the bank 130. The sidewall 132 portion of the lyophobic coating 150 may be further extended to cover a portion of the anode electrode 120 between the hole injection layer 161 and the sidewall 132. The extended portion of the lyophobic coating 150 may be disposed on the anode electrode 120 so as to surround the hole injection layer 161 in the top plan view. However, the invention is not limited thereto, and the lyophobic coating 150 may be omitted in an alternative embodiment.

A hole transport layer 162 and an emissive layer 163 may be sequentially disposed on the anode electrode 120 to cover the hole injection layer 161. The hole transport layer 162 may be disposed to cover (e.g., overlap) a space defined between the hole injection layer 161 and the sidewall 132 of the bank 130.

Where the organic electro-luminescent display 100 does not include the lyophobic coating 150, the hole transport layer 162 and the emissive layer 163 may be disposed to contact the sidewall 132 of the bank 130. In the absence of the lyophobic coating 150, the hole transport layer 162 may fill the space defined between the hole injection layer 161 and the sidewall 132 of the bank 130. Where the organic electro-luminescent display 100 includes the lyophobic coating 150, the lyophobic coating 150 may be disposed between the sidewall 132 of the bank 130 and the hole transport layer 162, and between the sidewall 132 of the bank 130 and the emissive layer 163.

An electron transport layer (not shown) and an electron injection layer (not shown) may further be sequentially disposed on the emissive layer 163. In an embodiment, where the organic electro-luminescent display 100 does not include the lyophobic coating 150, the electron transport layer and then electron injection layer may be disposed to contact the sidewall 132 of the bank 130. Where the organic electro-luminescent display 100 includes the lyophobic coating 150, the lyophobic coating 150 may be disposed between the sidewall 132 of the bank 130 and the electron transport layer and/or between the sidewall 132 of the bank 130 and the electron ejection layer.

A cathode electrode 170 that covers the emissive layer 163 may further be disposed on the bank 130. The cathode electrode 170 may be a common electrode of a display device. The cathode electrode 170 may include ITO.

An insulating layer 180 may be disposed to fill an area between the cathode electrode 170 and the second substrate 190. The insulating layer 180 may include a polymer material, such as PI resin. The insulating layer 180 may cover an entire region of the first substrate 110 and may reduce or effectively prevent degradation of the emissive layer 163 from gas and/or moisture.

In the organic electro-luminescent display 100 according to the embodiment, the hole injection layer 161 is separated from the sidewall 132 of the bank 130 to increase a distance to the cathode electrode 170. As such, a short circuit between the anode electrode 120 and the cathode electrode 170 may be reduced or effectively prevented.

Hereinafter, a method of fabricating the organic electro-luminescent display 100, according to the embodiment, will be described.

FIGS. 2A through 2F are schematic cross-sectional views illustrating a method of fabricating an organic electro-luminescent display according to an embodiment.

Figure 2A:
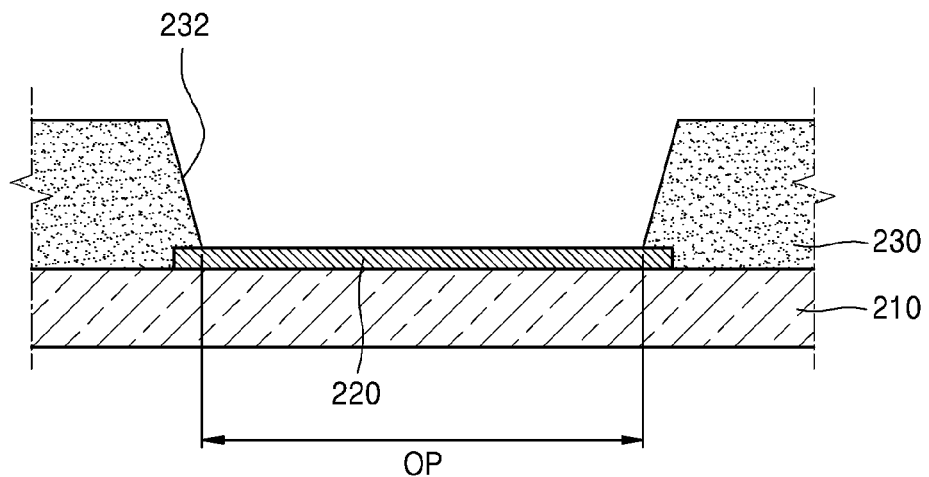
FIGS. 2A through 2F are schematic cross-sectional views illustrating a method of fabricating an organic electro-luminescent display according to an embodiment.

Referring to FIG. 2A, a first substrate 210 is prepared. The first substrate 210 may be formed of glass or plastic such as PEN, PI or PET.

An anode electrode 220 is formed on a pixel region of the organic electro-luminescent display such as by patterning an electrode material on the first substrate 210. The anode electrode 220 may be formed of ITO. The aforementioned pixel region may be a sub-pixel region of a pixel, that emits a single color.

An ultraviolet ("UV") ray may be irradiated onto an upper surface of the anode electrode 220 in order to increase a work function of the upper surface of the anode electrode 220 and to remove impurities therefrom. The upper surface of the anode electrode 220 may be $O_2$ plasma-processed. Accordingly, a surface energy of the upper surface of the anode electrode 220 may be increased.

A bank 230 is formed to be disposed around the anode electrode 220. Portions of the bank 230 define an opening portion OP therein. The opening portion OP may define the pixel region. The bank 230 may be formed by patterning PI. The bank 230 may also be formed of silicon oxide or silicon nitride. A bottom surface of the bank 230 may cover an edge of the anode electrode 220. In an embodiment, the bottom surface of the bank 230 may be disposed separated from (e.g., non-overlapping) an edge of the anode electrode 220. As depicted in FIG. 2A, a sidewall 232 of the bank 230 may be formed slanted at a predetermined angle with respect to the bottom surface of the bank 230.

Figure 2B:
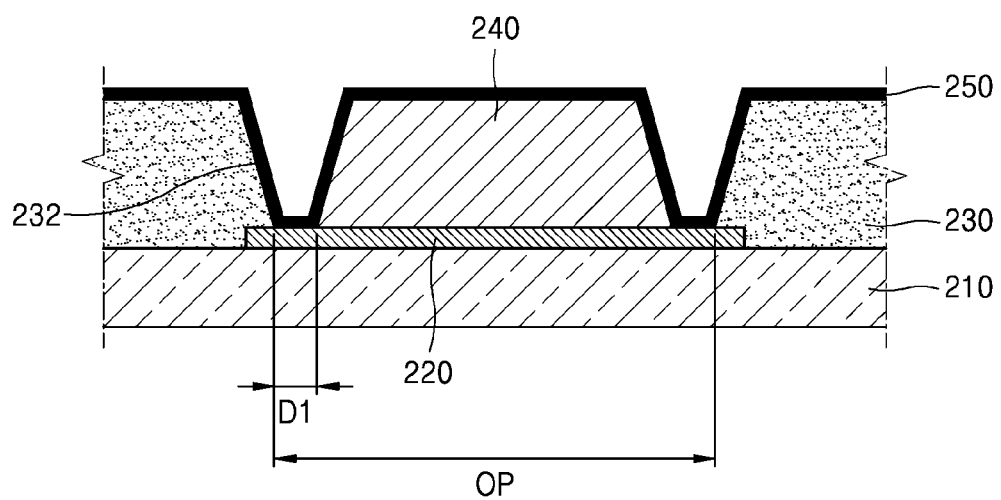

Referring to FIG. 2B, a photoresist pattern 240 is formed inside the opening portion OP and disposed separated from the sidewall 232 of the bank 230 by a first distance D1. The photoresist pattern 240 may be formed by using a photolithography method. The photoresist pattern 240 may be formed of a different material from the material used to form the bank 230 so that the bank 230 is not removed in a lift-off process which will be described below. The first distance D1 may be in a range from about 1 μm to about 10 μm.

A lyophobic coating 250 is formed on the first substrate 210. The lyophobic coating 250 may be formed by using a dip coating method. The lyophobic coating 250 may be formed to have a thickness in a direction normal to a surface of the bank 230, in a range from about 1 μm to about 10 μm. The lyophobic coating 250 is formed of a material having a lyophobic characteristic with respect to ink of an organic electro-luminescent display. In an embodiment, for example, the lyophobic coating 250 may be formed of an SAM, such as ODTS or n-octadecyltrichlorosilane, or an organic material that includes fluorine and has low surface energy, for example, EGC-1700 of 3M™ company.

Figure 2C:
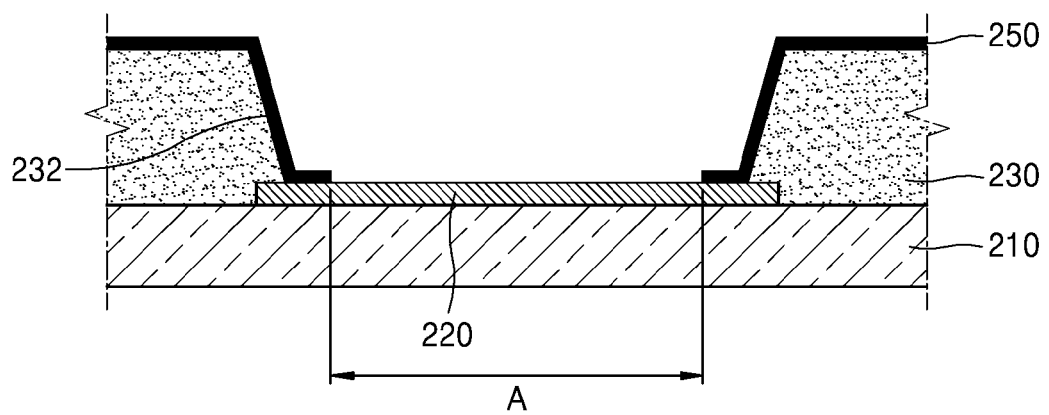

Referring to FIG. 2C, the photoresist pattern 240 is removed such as by using the lift-off process. Accordingly, in the region (region A) where the photoresist pattern 240 is removed, the lyophobic coating 250 that was formed on photoresist pattern 240 in the region A is also removed. The upper surface of the anode electrode 220 exposed in the region A has a higher surface energy than an upper surface of the anode electrode 220 in remaining regions thereof which are covered by the lyophobic coating 250.

Figure 2D:
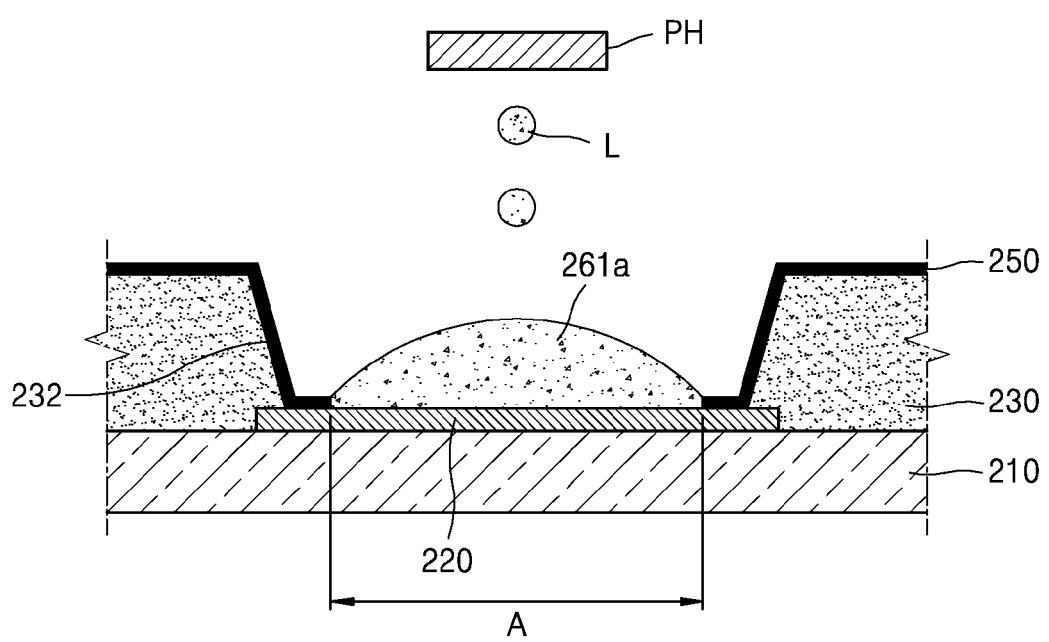

Referring to FIG. 2D, ink 261a for a hole injection layer 261 is printed on the region A such as by using an inkjet process. Droplets L ejected such as from an inkjet print head PH are relatively well adsorbed on a portion of the anode electrode 220 in the region A having the relatively high surface energy. When a surface tension of the ink 261a of the hole injection layer 261 is approximately 30 millinewtons per meter (mN/m), the ink 261a for the hole injection layer 261 may form a contact angle in a range from about 0 degrees (°) to about 15° with the region A that is treated with ultraviolet rays or plasma, and may form a contact angle in a range from about 30° to about 70° where the lyophobic coating 250 is formed. Accordingly, as depicted in FIG. 2D, the formation of the ink 261a for the hole injection layer 261 may be limited to the region A.

Figure 2E:
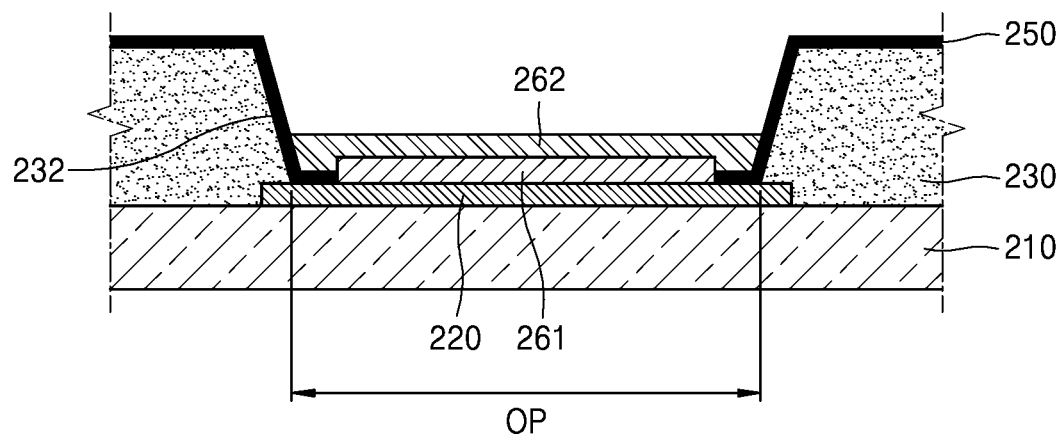

Referring to FIG. 2E, a solvent of the ink 261a is removed such as by a vacuum process and a heat treatment. The ink 261a may be dried by such process and treatment. The hole injection layer 261, on which a drying process has been performed, is flat. The hole injection layer 261 is formed separated from the sidewall 232 of the bank 230 by a first distance D1. When the heat treatment is performed at a higher temperature than about 200 degrees Celsius (° C.), the lyophobic coating 250 may be removed.

Next, a hole transport layer 262 is formed in the opening portion OP to cover the hole injection layer 261. The hole transport layer 262 may be formed to contact the sidewall 332 of the bank 330 or the lyophobic coating 250 that is formed on the sidewall 232 of the bank 230. Accordingly, the hole transport layer 262 may reduce or effectively prevent a short circuit between the anode electrode 220 and a cathode electrode 270 which will be described below.

Figure 2F:
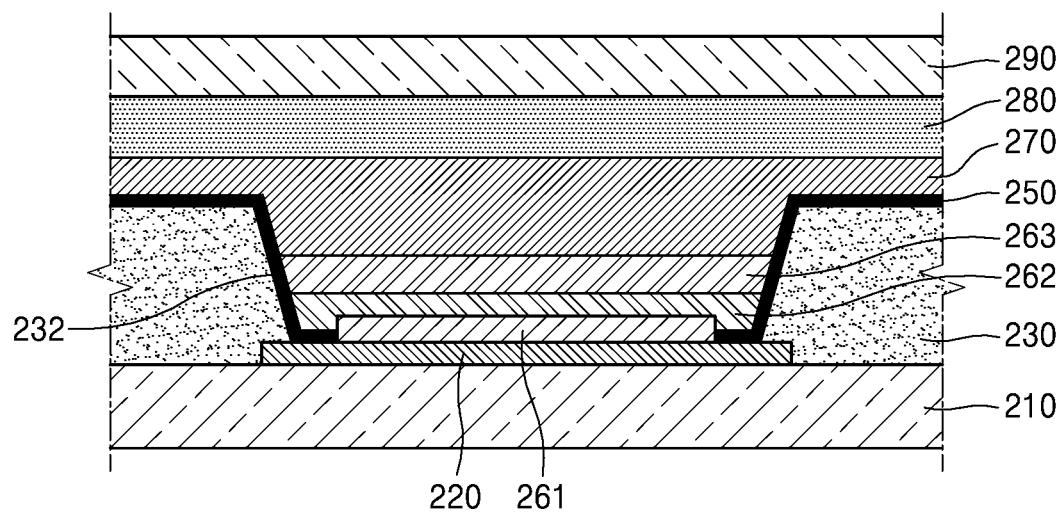

Referring to FIG. 2F, an emissive layer 263 is formed on the hole transport layer 262 in the opening portion OP. An electron transport layer (not shown) and an electron injection layer (not shown) may further be sequentially formed on the emissive layer 263. The hole transport layer 262 and the emissive layer 263 may be formed by using an inkjet process, a spin process or a deposition process.

The cathode electrode 270 that covers the emissive layer 263 may further be formed on the bank 230. The cathode electrode 270 may be a common electrode. The cathode electrode 270 may be formed of ITO.

An insulating layer 280 and a second substrate 290 are further formed on the cathode electrode 270. The processes of forming the insulating layer 280 and the second substrate 290 are well known in the art, and thus, the descriptions thereof will be omitted.

Figure 3A:
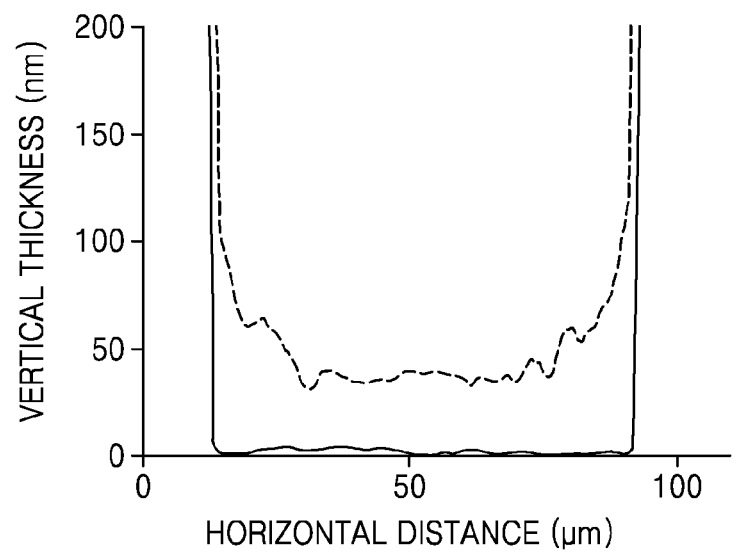
FIG. 3A is a graph showing cross-sectional (e.g., vertical) thicknesses in nanometers (nm) with respect to horizontal distances in micrometers (μm) of a hole injection layer formed without using a lyophobic coating.
Figure 3B:
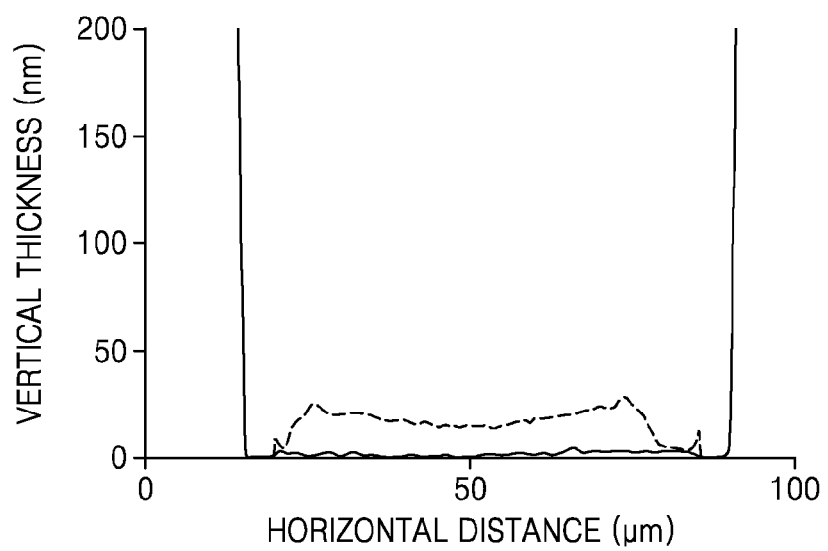
FIG. 3B is a graph showing cross-sectional thicknesses with respect to horizontal distances of a hole injection layer formed by using a lyophobic coating, according to embodiments.

FIG. 3A is a graph showing cross-sectional thicknesses (e.g., vertical) thicknesses in nm with respect to horizontal distances in μm of a hole injection layer formed without using a lyophobic coating, and FIG. 3B is a graph showing cross-sectional thicknesses with respect to horizontal distances of a hole injection layer formed by using the lyophobic coating, according to embodiments. A solid line curve indicates a cross-sectional profile of the bank, and a dashed line curve indicates a cross-sectional profile of the hole injection layer.

In preparing the samples represented in FIGS. 3A and 3B, a nozzle diameter of an inkjet printer was 9.5 μm, a volume of the droplet was 5 petaliters (pl), and a dimension of a pixel region was 210 μm×80 μm. FIGS. 3A and 3B represents cross-sectional views along a short side of the pixel region.

Referring to FIG. 3A, the hole injection layer is upwardly disposed along a sidewall of the bank, which allows a short circuit between the anode electrode and the cathode electrode. Also, it is seen that the hole injection layer is not flat.

However, referring to FIG. 3B, the hole injection layer is disposed separated from the walls of the bank, and thus, a distance of the hole injection layer from the cathode electrode is increased so as to reduce or effectively prevent a short circuit between the anode electrode and the cathode electrode. Also, the hole injection layer is disposed to be relatively flat, and thus, the light emitting characteristics of an organic electro-luminescent display that includes the hole injection layer may be good.

FIGS. 4A through 4F are cross-sectional views illustrating a method of fabricating an organic electro-luminescent display, according to another embodiment.

Figure 4A:
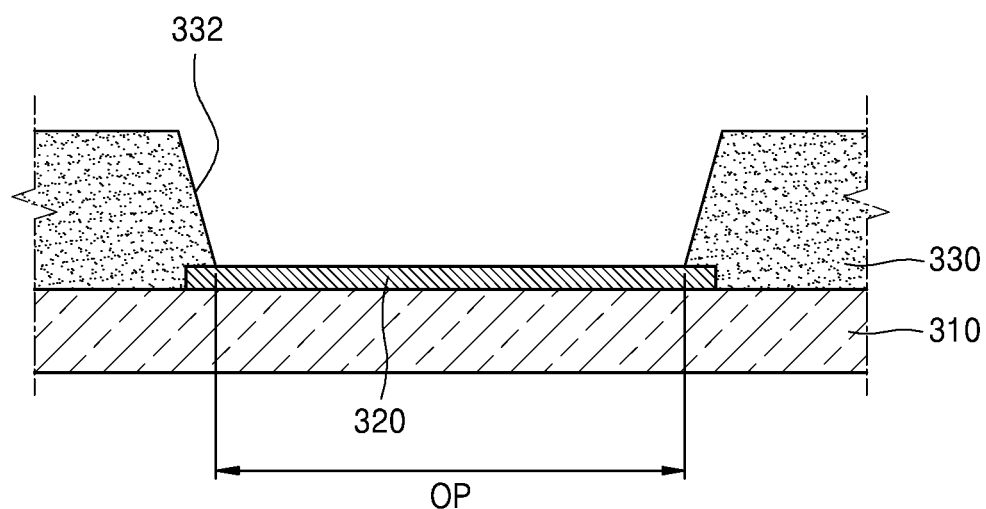
FIGS. 4A through 4F are cross-sectional views illustrating a method of fabricating an organic electro-luminescent display according to another embodiment.

Referring to FIG. 4A, a first substrate 310 is prepared. The first substrate 310 may be formed of glass or plastic such as PEN, PI or PET.

An anode electrode 320 is formed on a pixel region of the organic electro-luminescent display such as by patterning an electrode material on the first substrate 310. The anode electrode 320 may be formed of ITO. The aforementioned pixel region may be a sub-pixel region of a pixel, that emits a single color.

An ultraviolet ("UV") ray may be irradiated onto an upper surface of the first electrode 320 in order to increase a work function of the upper surface of the anode electrode 320 and to remove impurities from the upper surface of the anode electrode 320. The upper surface of the anode electrode 320 may be $O_2$ plasma-processed. Accordingly, a surface energy of the upper surface of the anode electrode 320 may be increased.

A bank 330 is formed to be disposed around the anode electrode 320 and portions of the bank 330 define an opening portion OP therein. The opening portion OP may define the pixel region. The bank 330 may be formed by patterning PI. The bank 330 may also be formed of silicon oxide or silicon nitride. A bottom surface of the bank 330 may cover an edge of the anode electrode 320. In an embodiment, the bottom surface of the bank 330 may be disposed separated from an edge of the anode electrode 320. As depicted in FIG. 4A, a sidewall 332 of the bank 330 may be formed slanted at a predetermined angle with respect to the bottom surface of the bank 330.

Figure 4B:
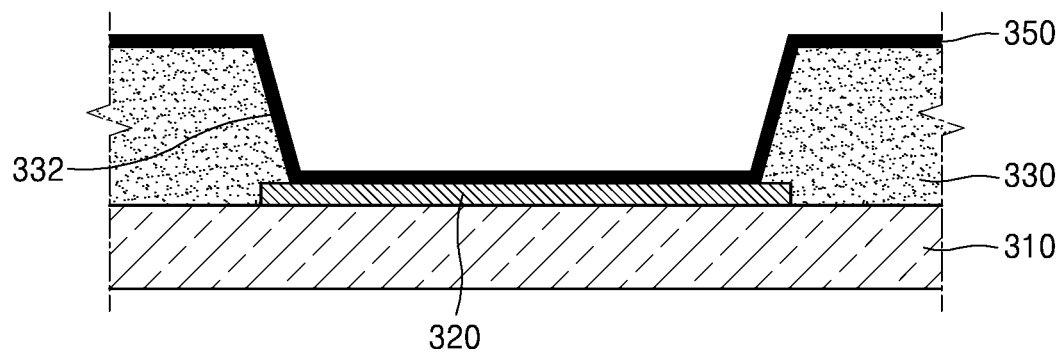

Referring to FIG. 4B, a lyophobic coating 350 is formed on the first substrate 310 to cover the anode electrode 320 and the bank 330. The lyophobic coating 350 may contact the anode electrode 320 exposed by the opening portion OP. The lyophobic coating 350 may be formed by using a dip coating method. The lyophobic coating 350 may be formed to have a thickness in a direction normal to a surface of the bank 330, in a range from about 1 μm to about 10 μm. The lyophobic coating 350 may be formed of a material having a lyophobic characteristic with respect to ink of an OLED. In an embodiment, for example, the lyophobic coating 350 may be formed of an SAM such as ODTS or n-octadecyltrichlorosilane, or an organic material that includes fluorine and has low surface energy, for example, EGC-1700 of 3M™ company.

Figure 4C:
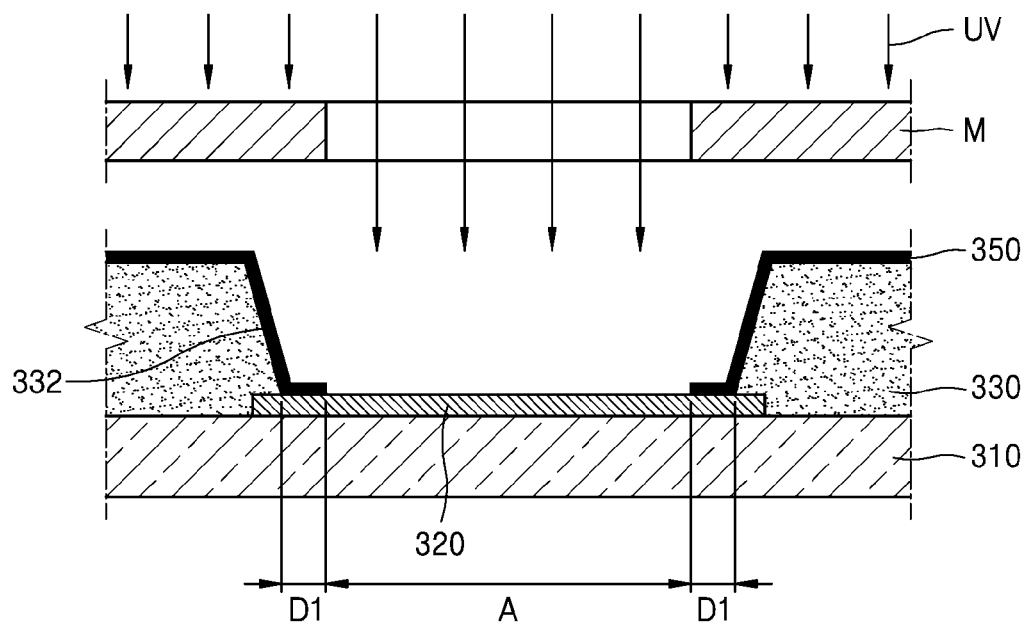

Referring to FIG. 4C, after irradiating an ultraviolet ray to the exposed lyophobic coating 350 by using a mask M, the lyophobic coating 350 that is formed on the pixel region where the UV is irradiated is removed. The region A where the lyophobic coating 350 is removed is separated from the sidewall 332 of the bank 330 by a first distance D1. The first distance D1 may be in a range from about 1 μm to about 10 μm. A portion of the anode electrode 320 in the region A has a lower surface energy than that of a portion in a remaining region thereof covered by the lyophobic coating 350.

Figure 4D:
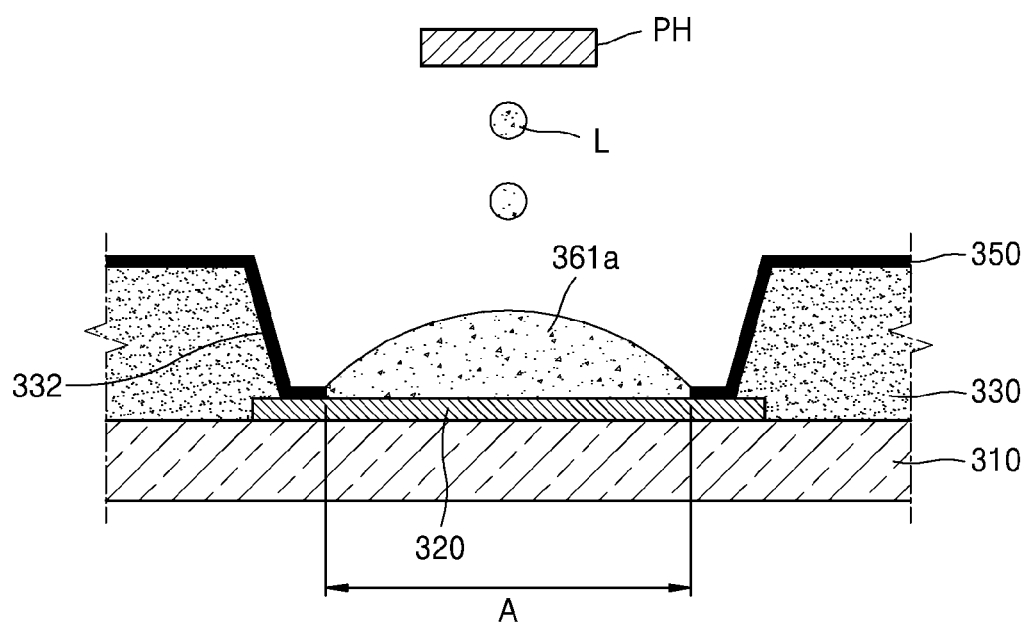

Referring to FIG. 4D, ink 361a for a hole injection layer 361 is printed on the region A such as by using an inkjet process. Droplets L ejected from an inkjet print head PH are relatively well adsorbed on a portion of the anode electrode 320 in the region A having the relatively low surface energy. When a surface tension of the ink 361a for the hole injection layer 361 is approximately 30 mN/m, the ink 361a for the hole injection layer 361 may form a contact angle in the region A that is treated with UV or plasma in a range from about 0° to about 15°, and may form a contact angle in a range from about 30° to about 70° where the lyophobic coating 350 is formed. Accordingly, as depicted in FIG. 4D, the formation of the ink 361a for the hole injection layer 361 may be limited to the region A.

Figure 4E:
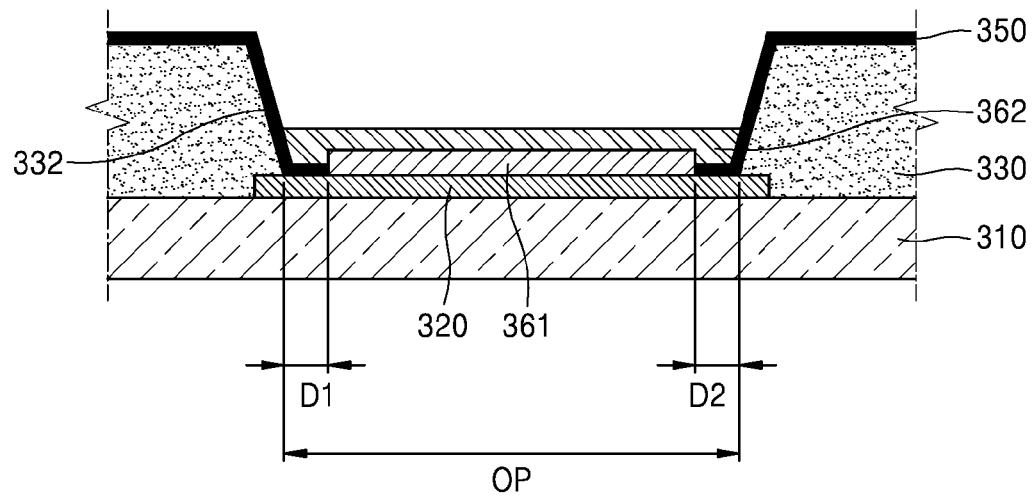

Referring to FIG. 4E, a solvent of the ink 361a is removed such as by a vacuum process and a heat treatment. The ink 361a may be dried by such process and treatment. The hole injection layer 361, on which a drying process has been performed, is flat. The hole injection layer 361 is formed separated from the sidewall 332 of the bank 330 by the first distance D1. When the heat treatment is performed at a higher temperature than about 200° C., the lyophobic coating 350 may be removed.

A hole transport layer 362 is formed in the opening portion OP to cover the hole injection layer 361. The hole transport layer 362 may be formed to contact the sidewall 332 of the bank 330 or to contact the lyophobic coating 350 on the sidewall 332 of the bank 330. Accordingly, the hole transport layer 362 may reduce or effectively prevent a short circuit between the anode electrode 320 and a cathode electrode 370 which will be described below.

Figure 4F:
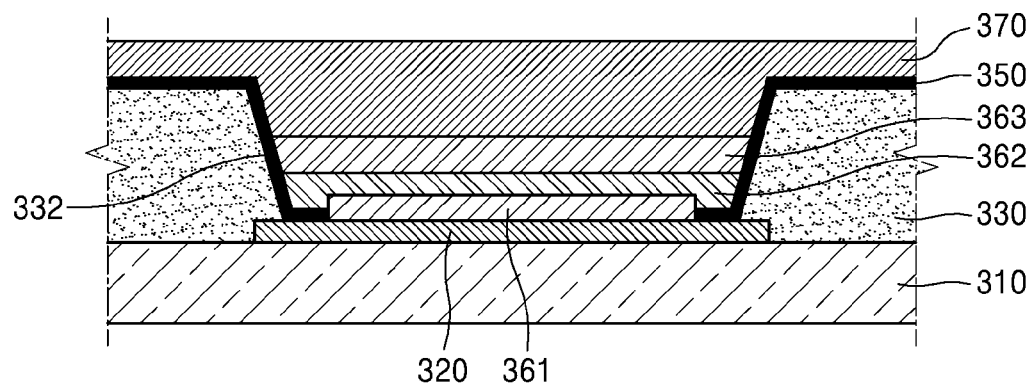

Referring to FIG. 4F, an emissive layer 363 is formed on the hole transport layer 362 in the opening portion OP. An electron transport layer (not shown) and an electron injection layer (not shown) may further be sequentially formed on the emissive layer 363. The hole transport layer 362 and the emissive layer 363 may be formed by using an inkjet process, a spin process or a deposition process.

The cathode electrode 370 may be formed on the bank 330 and covers the emissive layer 363. The cathode electrode 370 may be a common electrode. The cathode electrode 370 may be formed of ITO.

Referring to FIG. 1, an insulating layer and a second substrate are further formed on the cathode electrode 370. The processes of forming the insulating layer (refer to 180 of FIG. 1) and the second substrate (refer to 190 of FIG. 1) on the cathode electrode 370 are well known in the art, and thus, the descriptions thereof will be omitted.

One or more organic electro-luminescent display according to embodiments of the invention includes the hole injection layer disposed separated from the sidewall of the bank to be disposed further from the cathode electrode. Thus, distance between the hole injection layer and the cathode electrode is reduced or effectively prevented to avoid a short circuit between the anode electrode and the cathode electrode.

Also, since the hole injection layer is disposed to be relatively flat in the cross-sectional direction, the light emission characteristics of an organic electro-luminescent display that includes the relatively flat hole injection layer may be improved.

While one or more embodiments have been described with reference to the figures, it will be understood by those of ordinary skill in the art that various changes in form and details may be made therein without departing from the spirit and scope of the invention as defined by the following claims.

What is claimed is:

1. An organic electro-luminescent display comprising:
    an anode electrode disposed in a pixel region, on a substrate;
    a bank adjacent to an edge of the anode electrode, on the substrate, to define the pixel region;
    a hole injection layer on the anode electrode, to be separated from a sidewall of the bank by a first distance;
    a lyophobic coating covering at least a portion of the first distance between the hole injection layer and the sidewall of the bank;
    a hole transport layer and an emissive layer sequentially disposed on the hole injection layer, in the pixel region; and
    a cathode electrode disposed on the emissive layer.

2. The organic electro-luminescent display of claim 1, wherein the lyophobic coating is extended to be disposed between the sidewall of the bank and the hole transport layer, and between the sidewall of the bank and the emissive layer.

3. The organic electro-luminescent display of claim 2, wherein the lyophobic coating comprises a material having a surface energy lower than a surface energy of an upper surface of the anode electrode.

4. The organic electro-luminescent display of claim 3, wherein a thickness of the lyophobic coating is in a range from about 1 nanometer to about 10 nanometers.

5. The organic electro-luminescent display of claim 1, wherein the lyophobic coating contacts an edge of the hole injection layer.

6. The organic electro-luminescent display of claim 1, wherein the first distance is in a range from about 1 micrometer to about 10 micrometers.

7. The organic electro-luminescent display of claim 1, wherein the bank overlaps an edge of the anode electrode.

* * * * *